(12) United States Patent
Wu et al.

(10) Patent No.: US 10,319,614 B2
(45) Date of Patent: Jun. 11, 2019

(54) WAFER LEVELING DEVICE

(71) Applicant: E&R Engineering Corp., Kaohsiung (TW)

(72) Inventors: Wen Ren Wu, Kaohsiung (TW); Cho Chun Chung, Kaohsiung (TW)

(73) Assignee: E&R ENGINEERING CORP., Kaohsiung (TW)

( * ) Notice: Subject to any disclaimer, the term of this patent is extended or adjusted under 35 U.S.C. 154(b) by 0 days.

(21) Appl. No.: 15/051,829

(22) Filed: Feb. 24, 2016

(65) Prior Publication Data

US 2017/0062246 A1 Mar. 2, 2017

(30) Foreign Application Priority Data

Sep. 2, 2015 (TW) .............................. 104128976 A

(51) Int. Cl.
*H01L 21/67* (2006.01)
*H01L 21/683* (2006.01)
*H01L 21/687* (2006.01)

(52) U.S. Cl.
CPC .. *H01L 21/67092* (2013.01); *H01L 21/67288* (2013.01); *H01L 21/6838* (2013.01); *H01L 21/68735* (2013.01); *H01L 21/68785* (2013.01)

(58) Field of Classification Search
CPC ......... H01L 21/67092; H01L 21/68785; H01L 21/67288; H01L 21/68735; H01L 21/6838
See application file for complete search history.

(56) References Cited

U.S. PATENT DOCUMENTS

| | | | | |
|---|---|---|---|---|
| 8,276,898 | B2 * | 10/2012 | Avoyan | C25D 17/06 269/21 |
| 2011/0250044 | A1 * | 10/2011 | Obweger | H01L 21/683 414/757 |
| 2014/0030048 | A1 * | 1/2014 | Kosuge | H01L 21/677 414/225.01 |

* cited by examiner

*Primary Examiner* — David P Bryant
*Assistant Examiner* — Nirvana Deonauth
(74) *Attorney, Agent, or Firm* — Bacon & Thomas, PLLC

(57) ABSTRACT

The present disclosure relates to a wafer leveling device which comprises a carrier module, a fixture module and a dynamic module. A wafer, which is conveyed to and stays above a claw component of the carrier module by a robotic arm, is further carried by the lifted claw component for a continuous ascent until the wafer is contacted by a ring component of the fixture module; the clamp component of the fixture module releases the ring component; the claw component, the ring component and the wafer, all of which keep stabilized mutual positions, are lowered so that several protrudent structures on a base component of the carrier module contact the wafer; the claw component, the ring component and the wafer which completes a manufacturing process are lifted; the carrier module and the wafer are lowered with the clamp components stabilizing the ring component.

10 Claims, 7 Drawing Sheets

WAFER LEVELING DEVICE

BACKGROUND OF THE INVENTION

1) Field of the Invention

The present disclosure relates to a wafer leveling device which enhances flatness of a wafer during a manufacturing process and particularly flatness of a large-sized or thinned wafer which is warped and goes against precision of a manufacturing process for the wafer.

2) Description of the Prior Art

In recent years, smart phones have been a part of every consumer's life in addition to all types of wearable devices getting more popular with the general public. It can be seen from the trend of consumer goods that merchandise is being miniaturized for strengthened computing power.

Basically, the consumer goods are electronic devices characteristic of compact sizes and good computing power, both of which can be promoted with manufacturing processes based on the well-known "Moore's Law". In semiconductor manufacturing processes, the laser marking process depends on the laser beam to label marks on wafers for the following die-saw process.

There haven been multiple patents for wafer leveling presented as follows:

Publication No. TW 1362084 discloses a device of removing warps of a wafer, comprising: a wafer support component which contacts the rim of the bottom surface of a wafer to be marked and supports the wafer; a press component placed on the wafer support component and moved between up and down positions wherein the press component at the down position applies pressure on the rim of the upper surface of the wafer, which is supported by the wafer support component, and toward the wafer support component and the press component at the up position moves upward and releases the wafer; a driving device which lifts the press component until the up position.

Publication No. TW 1233197 discloses a chip scale marker characterized in that: a laser system is used in laser marking; a wafer support on which a wafer to be marked is carried comprises a vacuum panel centrally mounted on the wafer support to absorb the wafer and a wafer spin unit installed around the vacuum panel and being opposite to an open region of the laser system; a camera over the wafer support takes photos of the wafer; a warp removal unit over the wafer support eliminates any warp of the wafer.

Publication No. TW 1487017 discloses a lamination device comprising an upper gripper and a lower gripper to hold a wafer: the upper gripper which resists a certain pressure is warped at the central portion; the lower gripper is downward provided with a peripheral insulating ring supporting the lower gripper. The insulating ring comprises a plurality of insulating components; the insulating ring is supported with a plurality of supporting components which form a supporting ring. Each of the supporting components is fixed on the lower gripper with a corresponding screw. A screw is driven into an insulating component and a through hole opened to support the insulating component. A through hole is greater than a screw in diameter.

However, pressures are applied on front and back rims of a warped wafer during calibrations by two planes at which there is no flexible space but bring more stresses on the wafer.

To settle the above issues, the present disclosure is to offer a wafer leveling device.

SUMMARY OF THE INVENTION

In view of the above issues, the present disclosure describes a wafer leveling device which relies on a claw component, a base component and a ring component to level and stabilize a wafer and a dynamic module to ascend/descend a wafer effectively.

The present disclosure is to provide a wafer leveling device with multiple components for reducing stresses on the surface of a wafer.

The present disclosure is to provide a wafer leveling device which prevents a wafer from any contact damage between the wafer and the wafer leveling device by means of auxiliary feed-in units made of bevel soft material.

The present disclosure is to provide a wafer leveling device which removes possible shifts of a wafer to be leveled by means of magnetic components.

The present disclosure is to provide a wafer leveling device which relies on three groups of motors to drive a wafer for up/down movements without instability of the wafer.

To this end, a wafer leveling device in the present disclosure is embodied with technical measures as follows. A wafer leveling device comprises: a carrier module with a claw component and a base component; a fixture module with a ring component which is fixed with a clamp component; a dynamic module which drives the claw component to reach an up position or a down position; a wafer leveling device is characterized in that: the edges of several claw structures at the lifted claw component contact the bottom surface of the wafer which has been conveyed to and stays above the claw component by a robotic arm; the ring component contacts the rim of the upper surface of the wafer with the claw component lifted and the clamp components release the ring component; the claw component, the ring component and the wafer, all of which keep stabilized mutual positions, are lowered so that several protrudent structures on the base component contact the rim of the bottom surface of the wafer; the claw component, the ring component and the wafer which completes a manufacturing process are lifted; the carrier module and the wafer is lowered with the clamp components stabilizing the ring component.

A wafer leveling device further depends on following technical measures to realize purposes and techniques.

In the wafer leveling device, the claw component has an opening.

In the wafer leveling device, the claw structure comprises at least an auxiliary feed-in unit.

In the wafer leveling device, the ring component comprises at least a first positioning magnetic unit which magnetically attracts at least a second positioning magnetic unit at the base component.

In the wafer leveling device, the claw structure and at least a base positioning structure at the base component stabilize each other for immobilization.

In the wafer leveling device, the dynamic module comprises a curved stabilizing component, at least a right-angle mounting component, at least a vertical movement component, at least a vertical track component and at least a driving motor component: a claw component and a right-angle mounting component are fixed on the upper surface of a curved stabilizing component; the vertical movement components are driven by the driving motor components so that the right-angle mounting components fixed on the vertical movement components are lifted/lowered by the adjacent vertical track components and the curved stabilizing component is driven indirectly.

In the wafer leveling device, the right-angle mounting component comprises a check unit which coordinates a sensor unit on the driving motor component to check and verify homing of the driving motor component.

In the wafer leveling device, the right-angle mounting component comprises a proximity check unit which coordinates a sensor block on the driving motor component to check a distance in between.

In the wafer leveling device, the fixture module comprises a vacuum component.

In contrast to conventional techniques, a wafer leveling device in the present disclosure has advantages as follows: (1) less stress on the surface of a wafer; (2) less damage to a wafer which is contacted by a wafer leveling device; (3) applications of magnetic components for fewer shifts of a wafer during leveling.

BRIEF DESCRIPTIONS OF THE DRAWINGS

DETAILED DESCRIPTIONS OF THE PREFERRED EMBODIMENTS

Figure 1:
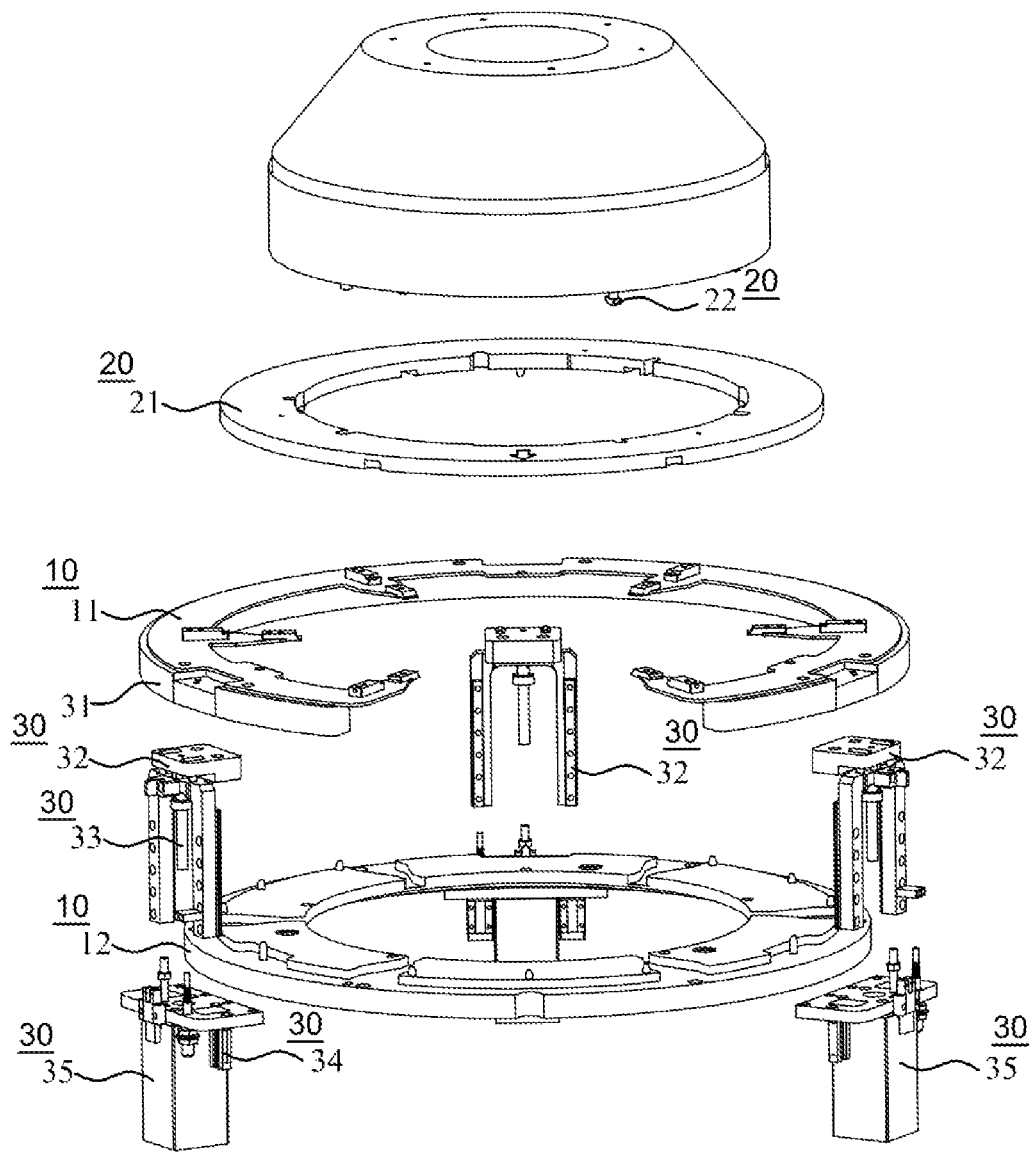
FIG. 1 is an exploded view of a wafer leveling device in a preferred embodiment.

A wafer leveling device will be further illustrated in preferred embodiments for clear understanding of purposes, characteristics and effects:

FIG. 1 to FIG. 11 present a wafer leveling device in preferred embodiments. Referring to FIG. 1 which illustrates a wafer leveling device comprises a carrier module (10), a fixture module (20) and a dynamic module (30): the carrier module (10) comprises a claw component (11) and a base component (12); the fixture module (20) comprises a ring component (21) and a clamp component (22).

Figure 2:
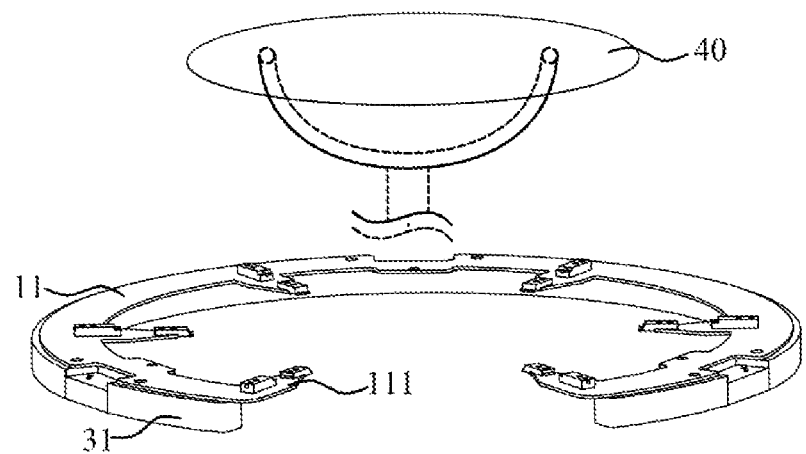
FIG. 2 is a first schematic view of a wafer leveling device in a preferred embodiment.

Specifically, as shown in FIG. 1, the carrier module (10), which is a load-bearing module under a wafer, is divided into the claw component (11) and the base component (12). As shown in FIG. 2, the edges of several claw structures (111) at the claw component (11) lifted by the dynamic modules (30) (not shown in the figure) contact the bottom surface of the wafer (40), which has been conveyed to and stays above the claw component (11) by a robotic arm, and the wafer (40) is further carried and shifted by the claw component (11) effectively for up-down movements; as shown in FIGS. 1 and 3, the base component (12) is taken as a device for positioning and load bearing of the claw component (11), the ring component (21) and the wafer (40), all of which are stacked vertically, and comprises several protrudent structures (121) (FIG. 7) partially contacting the rim of the bottom surface of the wafer (40).

Figure 5A:
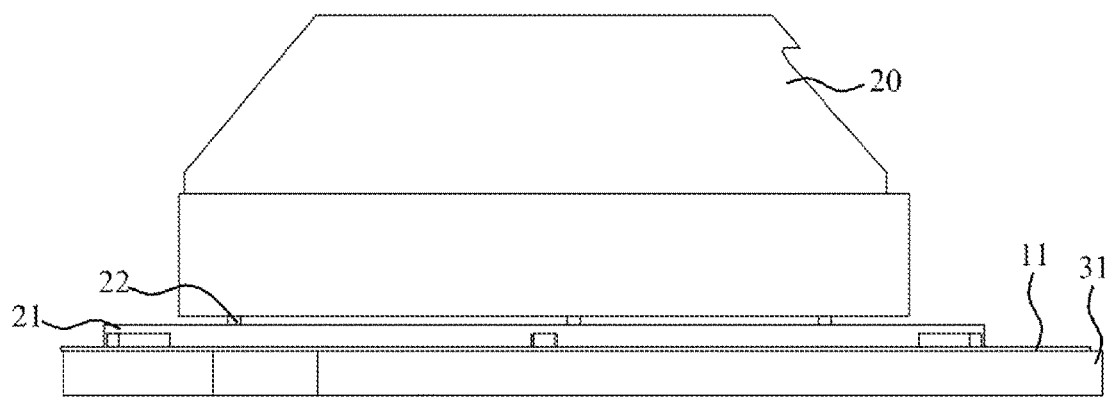
FIG. 5a is a third schematic view of a wafer leveling device in a preferred embodiment.
Figure 5B:
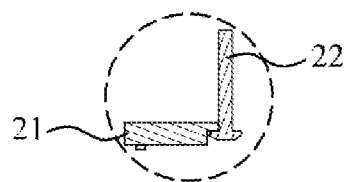
FIG. 5b is a schematic view which illustrates a fixed ring component of a wafer leveling device in a preferred embodiment.
Figure 8:
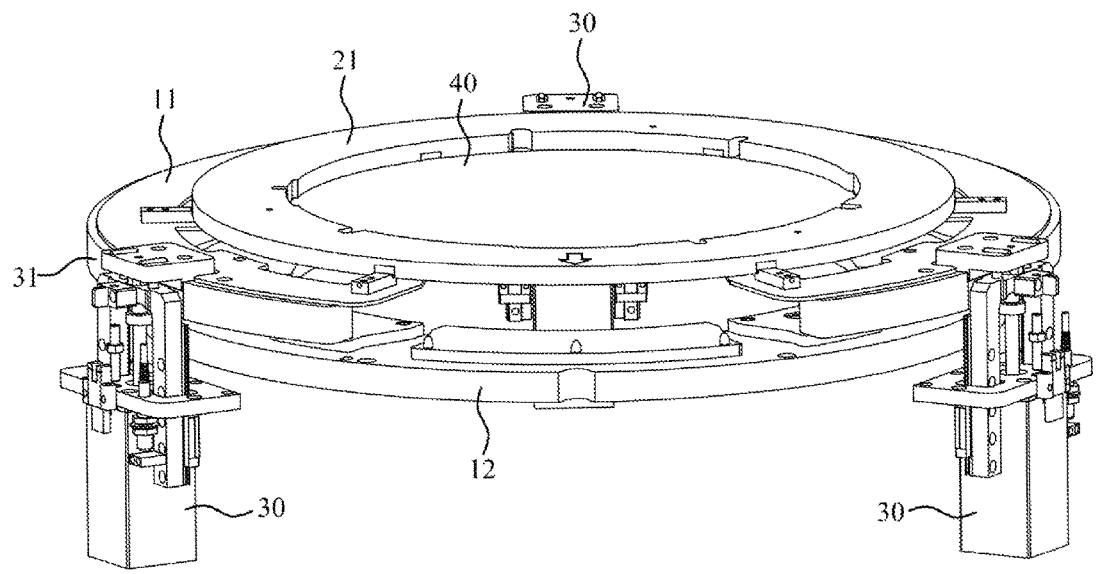
FIG. 8 is a fourth schematic view of a wafer leveling device in a preferred embodiment.

The fixture module (20) is a module staying above and stabilizing a wafer and divided into the ring component (21) and the clamp components (22), as shown in FIG. 1. With the ring component (21) contacting the wafer (40) (not shown in the figure) carried by the claw component (11) (as shown in FIG. 5a), the ring component (21) initially stabilized by the clamp components (22) (as shown in FIG. 5b) is destabilized by the clamp components (22) and stays above the wafer (40) as well as the claw component (11) (as shown in FIG. 8) wherein the clamp components (22) stabilize the ring component (21) by means of fastening, absorption or latching, for example, the ring component (21) is fastened with the clamp components (22) which are separated from one another by 120 degrees in the embodiment (as shown in FIG. 1).

Figure 3:
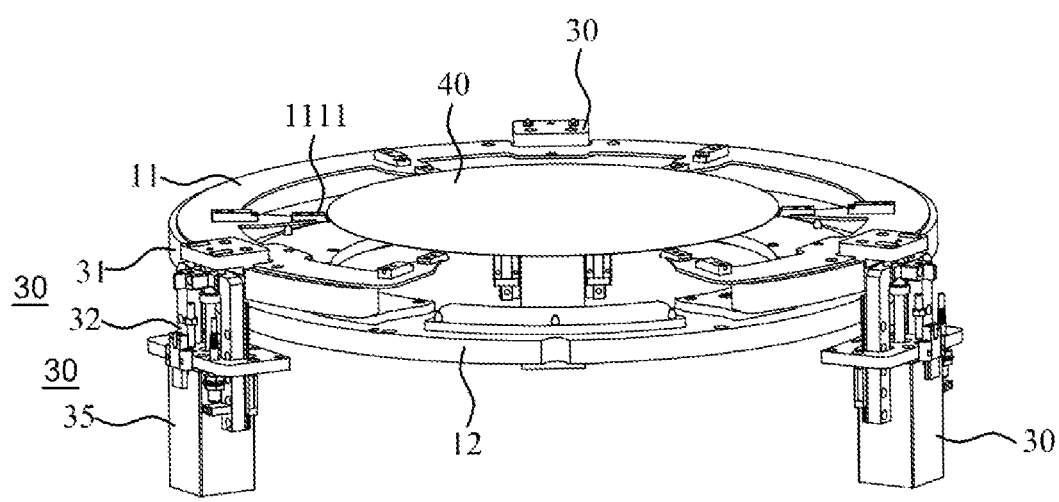
FIG. 3 is a second schematic view of a wafer leveling device in a preferred embodiment.
Figure 6:
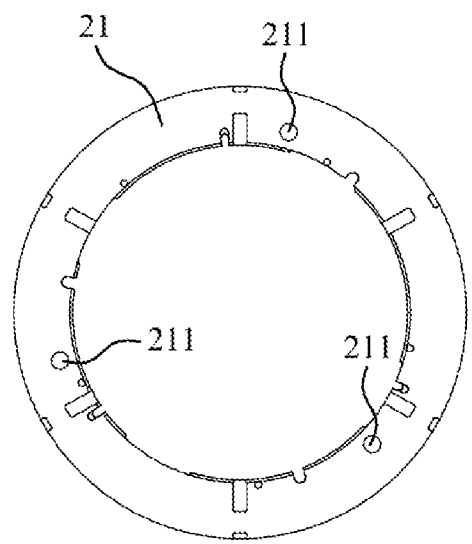
FIG. 6 is a schematic view which illustrates a ring component of a wafer leveling device in a preferred embodiment.
Figure 7:
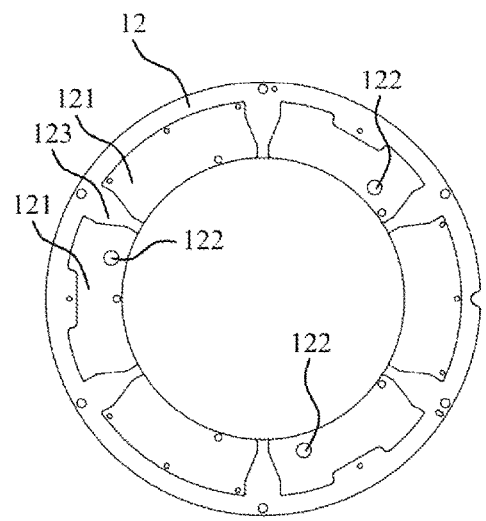
FIG. 7 is a schematic view which illustrates a base component of a wafer leveling device in a preferred embodiment.

Preferably, the claw component (11) has at least an auxiliary feed-in unit (1111) and an opening (112) (FIG. 4) which is passed by the robotic arm (FIG. 2) when the wafer (40) is carried by the lifting claw component (11) and further by the auxiliary feed-in units (1111) made of bevel soft material, as shown in FIG. 3; moreover, referring to FIGS. 6 and 7 that illustrate the ring component (21) comprises at least a first positioning magnetic unit (211) magnetically attracting at least a second positioning magnetic unit (122) on the base component (12) to stabilize the ring component (21), the wafer (40), the claw component (11) and the base component (12), all of which are stacked sequentially, and make the claw structure (111) and the base positioning structures (123) among the protrudent structures (121) stabilize each other.

Figure 10:
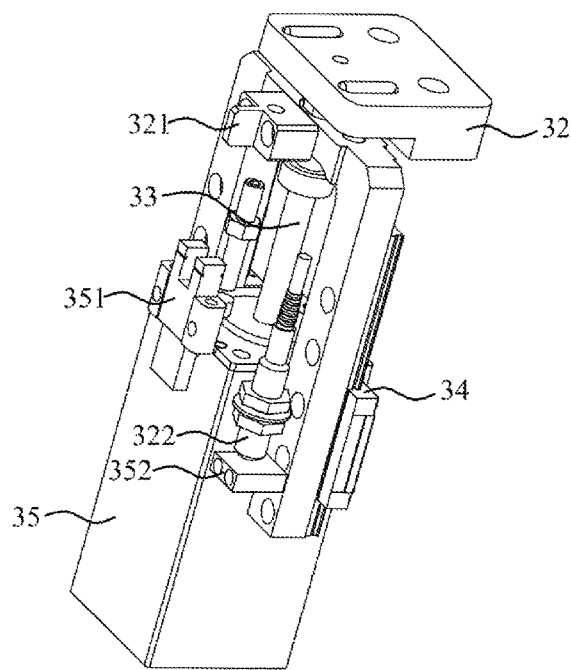
FIG. 10 is a schematic view which illustrates a dynamic module of a wafer leveling device in a preferred embodiment.
Figure 11:
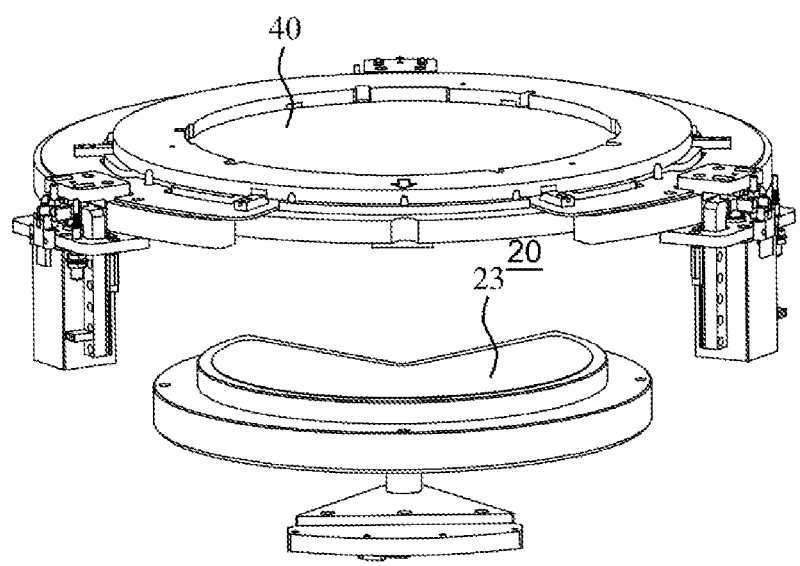
FIG. 11 is a sixth schematic view of a wafer leveling device in a preferred embodiment.

Referring to FIGS. 3 and 10 which illustrate the dynamic module (30) comprises a curved stabilizing component (31), at least a right-angle mounting component (32), at least a vertical movement component (33), at least a vertical track component (34) and at least a driving motor component (35): a claw component (11) and a right-angle mounting component (32) are fixed on the upper surface of a curved stabilizing component (31) (FIG. 3); the vertical movement components (33) are driven by the driving motor components (35) so that the right-angle mounting components (32) fixed on the vertical movement components (33) are lifted/lowered by the adjacent vertical track components (34) and the curved stabilizing component (31) is driven indirectly.

Specifically, referring to FIG. 10 which illustrates the curved stabilizing component (31) is coupled with the claw component (11) and the right-angle mounting components (32) by means of fastening, absorption or latching (FIG. 3) for reduced direct joints between the claw component (11) and the right-angle mounting components (32) or consequential structural deformation and convenient removals/replacements as required; as shown in FIG. 1, a right-angle mounting component (32) with uncased vertical/horizontal structural planes is driven by motive force, which is delivered from the driving motor component (35) and a vertical movement component (33) for an accurate vertical movement based on a vertical track component (34) beside the driving motor component (35), and finally the curved stabilizing component (31) is indirectly driven for up/down movements.

Preferably, as shown in FIG. 10, each of the right-angle mounting components (32) comprises a check unit (321) and a proximity check unit (322) and each of the driving motor components (35) comprises a sensor unit (351) and a sensor block (352). To make sure of a correct initial position, the check unit (321) coordinates the sensor unit (351) to check and verify homing of the driving motor component (35) because the claw component (11) is indirectly shifted in the vertical direction by movements of the right-angle mounting components (32); moreover, to make sure of a right-angle mounting component (32) in place, the proximity check unit (322) coordinates the sensor block (352) to check a mutual distance in between; to further promote the level of the wafer (40) in process, a vacuum component (23) can be installed under the wafer (40).

A wafer leveling device in the present disclosure is further explained in preferred embodiments hereinafter.

Referring to FIG. 2 which illustrates the wafer (40) is transported to and stays above the claw component (11) by the robotic arm; as shown in FIG. 10, the vertical movement component (33) is driven and moved by the driving motor component (35) and both the curved stabilizing component (31) and the claw component (11) are lifted simultaneously by the right-angle mounting component (32) which is upward driven by the vertical track component (34).

Figure 4:
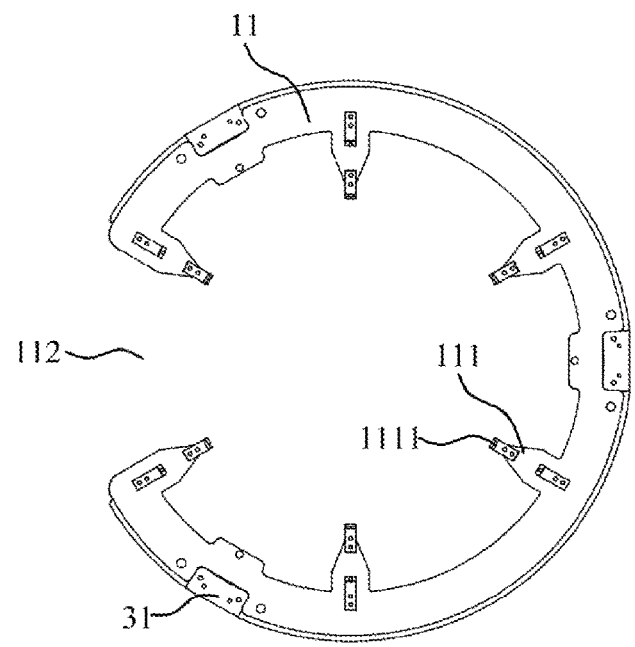
FIG. 4 is a schematic view which illustrates a claw component of a wafer leveling device in a preferred embodiment.

Referring to FIGS. 3 and 4 which illustrate the edges of the claw structures (111) of the lifted claw component (11) contact the bottom surface of the wafer (40) and the robotic arm on which no wafer is loaded leaves.

Referring to FIG. 5a which illustrates: the ring component (21) contacts the rim of the upper surface of the wafer (40) with the curved stabilizing component (31) driving and lifting the claw component (11); the ring component (21) is released from the clamp component (22) when the ring component (21) stops ascending.

Referring to FIG. 8 which illustrates relative positions of the claw component (11), the ring component (21) and the wafer (40); then, as shown in FIG. 10 in which the vertical movement component (33) is driven and shifted by the driving motor component (35), both the curved stabilizing component (31) and the claw component (11) are lowered simultaneously by the right-angle mounting components (32) which are downward moved by the vertical track components (34).

Figure 9:
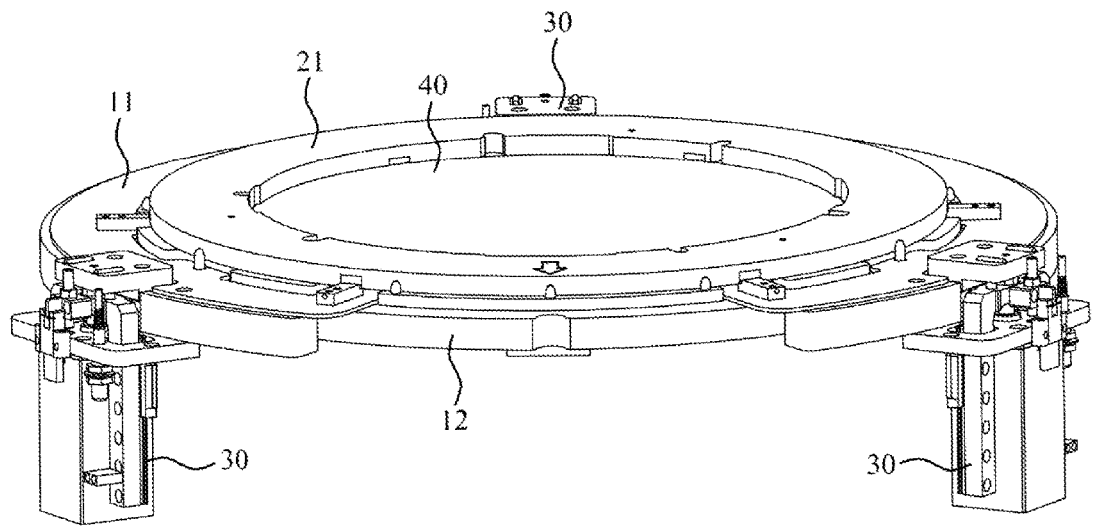
FIG. 9 is a fifth schematic view of a wafer leveling device in a preferred embodiment.

Referring to FIG. 9 which illustrates relative positions of the claw component (11), the ring component (21) and the wafer (40) at a reduced height so that several protrudent structures (121) on the base component (12) contact the rim of the bottom surface of the wafer (40) and the claw component (11) stop moving; then, the first positioning magnetic units (211) (FIG. 6) and the second positioning magnetic units (122) (FIG. 7) magnetically attract each other for stabilized mutual positions so that the claw structure (111) (FIG. 4) and the base positioning structures (123) among the protrudent structures (121) (FIG. 7) stabilize each other and the wafer (40) under which a vacuum component (23) is installed is leveled through vacuum suction.

A wafer leveling device is shifted to an initial position by an XY sliding bed device for continuing subsequent steps.

Referring to FIG. 8 which illustrates relative positions of the claw component (11), the ring component (21) and the wafer (40); then, as shown in FIG. 10 in which the vertical movement component (33) is driven and shifted by the driving motor component (35), both the curved stabilizing component (31) and the claw component (11) are lifted simultaneously by the right-angle mounting components (32) which are upward moved by the vertical track components (34).

Referring to FIG. 5a which illustrates: the claw component (11) is driven and lifted by the curved stabilizing component (31) so that the ring component (21) stays within the reach of the clamp component (22) for immobilization and is stabilized by the clamp component (22) with the claw component (11) stopping an upward movement.

Referring to FIGS. 3 and 4 which illustrate the surface of the back of the wafer (40) is contacted by the robotic arm when the claw component (11) descends. As shown in FIG. 10 in which the vertical movement component (33) is driven and shifted by the driving motor component (35), the claw component (11) is simultaneously moved by the right-angle mounting components (32) which are downward driven by the vertical track component (34). As shown in FIG. 2, the wafer (40) having experienced a manufacturing process is carried by the robotic arm, the claw component (11) stops running with the check units (321) coordinating the sensor units (351) to check and verify homing of the driving motor components (35), and the robotic arm carries the old wafer (40) away and waits for a new wafer (40) for a manufacturing process.

Accordingly, a wafer leveling device in the present disclosure, which differs from other leveling device and is referred to as creative work in the semiconductor industry, meets patentability and is applied for the patent.

It should be reiterated that the above descriptions present preferred embodiments, and any equivalent change in specifications, claims, or drawings still belongs to the technical field within the present disclosure with reference to claims hereinafter.

What is claimed is:

1. A wafer leveling device, comprising: a carrier module (10) with a claw component (11) having a plurality of claw structures (111) vertically stacked on top of a ring-shaped base component (12) for positioning and load bearing of the claw component (11); a fixture module (20) comprising a ring component (21) having a ring shape which is vertically stacked on the claw component (11), and a clamp component (22) vertically stacked on top of the ring component (21); the clamp component (22) releasably attached to the ring component (21), a dynamic module (30) which lifts the claw component (11) to reach an up position and lowers the claw component (11) to reach a down position, wherein the dynamic module (30) comprises at least one driving motor component (35), a curved stabilizing component (31) below the claw component (11), at least one right-angle mounting component (32) extending perpendicular to at least one vertical movement component (33) and at least one vertical track component (34), the claw component (11) and the curved stabilizing component (31) having at least one aligned slot aligned with and receiving the at least one right-angle mounting component (32), wherein: edges of the claw structures (111) contact a bottom surface of the wafer (40) when the claw component (11) is lifted to the up position by the dynamic module (30) after the wafer (40) has been conveyed to and held above the claw component (11) by a robotic arm, the ring component (21) contacts a rim of an upper surface of the wafer (40) after the claw component (11) is lifted to the up position by the dynamic module (30) and the clamp components (22) release the ring component (21), the claw component (11), the ring component (21) and the wafer (40), all of which keep stabilized mutual positions, are lowered to the down position in which several protrudent structures (121) on the base component (12) contact a rim of the bottom surface of the wafer (40), after which the wafer (40) undergoes a manufacturing process, the claw component (11), the ring component (21) and the wafer (40) are lifted to the up position after the wafer (40) completes the manufacturing process, and the carrier module (10) and the wafer (40) are then lowered while the clamp components (22) hold the ring component (21) in the up position to enable removal of the wafer (40) by the robotic arm.

2. A wafer leveling device as claimed in claim 1 wherein the claw component (11) has an opening (112).

3. A wafer leveling device as claimed in claim 1 wherein the claw structure (111) comprises at least an auxiliary feed-in unit (1111).

4. A wafer leveling device as claimed in claim 1 wherein the ring component (21) comprises at least a first positioning magnetic unit (211) which magnetically attracts at least a second positioning magnetic unit (122) at the base component (12).

5. A wafer leveling device as claimed in claim 1 wherein the claw structure (111) and at least a base positioning structure (123) at the base component (12) stabilize each other for immobilization.

6. A wafer leveling device as claimed in claim 1 wherein the curved stabilizing component (31) is coupled with the claw component (11) and the at least one right-angle mounting component (32) by means of fastening, absorption or latching, and the at least one right-angle mounting component (32) and the at least one vertical movement component (33) are driven by a driving motor components (35) so that the at least one right-angle mounting component (32) fixed on the at least one vertical movement component (33) is lifted or lowered by an adjacent said at least one vertical track component (34) and the curved stabilizing component (31).

7. A wafer leveling device as claimed in claim 6 wherein the right-angle mounting component (32) comprises a check unit (321) which coordinates a sensor unit (351) on the driving motor component (35) to check and verify homing of the driving motor component (35).

8. A wafer leveling device as claimed in claim 6 wherein the right-angle mounting component (32) comprises a proximity check unit (322) which coordinates a sensor block (352) on the driving motor component (35) to check a distance in between.

9. A wafer leveling device as claimed in claim 1 wherein the fixture module (20) comprises a vacuum component (23).

10. A wafer leveling device, comprising: a carrier module (10) with a claw component (11) having a plurality of claw structures (111) vertically stacked on top of a ring-shaped base component (12); a fixture module (20) comprising a ring component (21) having a ring shape which is vertically stacked on the claw component (11), and a clamp component (22) vertically stacked on top of the ring component (21); the clamp component (22) releasably attached to the ring component (21), a dynamic module (30) which lifts the claw component (11) to reach an up position and lowers the claw component (11) to reach a down position, wherein the dynamic module (30) comprises at least one driving motor component (35), a curved stabilizing component (31) below the claw component (11), at least one right-angle mounting component (32) extending perpendicular to at least one vertical movement component (33) and at least one vertical track component (34), the claw component (11) and the curved stabilizing component (31) having at least one aligned slot aligned with and receiving the at least one right-angle mounting component (32), wherein: edges of the claw structures (111) contact a bottom surface of the wafer (40) when the claw component (11) is lifted to the up position by the dynamic module (30) after the wafer (40) has been conveyed to and held above the claw component (11) by a robotic arm, the ring component (21) contacts a rim of an upper surface of the wafer (40) after the claw component (11) is lifted to the up position by the dynamic module (30) and the clamp components (22) release the ring component (21), the claw component (11), the ring component (21) and the wafer (40), all of which keep stabilized mutual positions, are lowered to the down position in which several protrudent structures (121) on the base component (12) contact a rim of the bottom surface of the wafer (40), after which the wafer (40) undergoes a manufacturing process, the claw component (11), the ring component (21) and the wafer (40) are lifted to the up position after the wafer (40) completes the manufacturing process, and the carrier module (10) and the wafer (40) are then lowered while the clamp components (22) hold the ring component (21) in the up position to enable removal of the wafer (40) by the robotic arm, wherein the fixture module (20) comprises a vacuum component (23).

* * * * *